(12) United States Patent
Tanaka

(10) Patent No.: US 9,178,287 B2
(45) Date of Patent: Nov. 3, 2015

(54) MULTI-CORE CABLE ASSEMBLY

(71) Applicant: SUMITOMO ELECTRIC INDUSTRIES, LTD., Osaka-shi, Osaka (JP)

(72) Inventor: Masato Tanaka, Kanuma (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 13/937,496

(22) Filed: Jul. 9, 2013

(65) Prior Publication Data

US 2014/0014410 A1 Jan. 16, 2014

(30) Foreign Application Priority Data

Jul. 10, 2012 (JP) .................................. 2012-154180

(51) Int. Cl.
| | |
|---|---|
| H01R 4/00 | (2006.01) |
| H01R 9/03 | (2006.01) |
| H05K 3/34 | (2006.01) |
| H05K 1/11 | (2006.01) |

(52) U.S. Cl.
CPC .................. *H01R 4/00* (2013.01); *H01R 9/034* (2013.01); *H05K 3/3405* (2013.01); *H05K 1/117* (2013.01); *H05K 2201/094* (2013.01); *H05K 2201/09809* (2013.01); *H05K 2201/10356* (2013.01)

(58) Field of Classification Search
CPC .............. H05K 2201/094; H05K 2201/09809; H05K 2201/10356

USPC ................ 174/84 R, 88 B; 439/877; 384/144
See application file for complete search history.

(56) References Cited

U.S. PATENT DOCUMENTS

| | | | | |
|---|---|---|---|---|
| 4,343,528 | A * | 8/1982 | Lucius et al. .................. | 439/601 |
| 4,602,832 | A * | 7/1986 | Cunningham et al. ........ | 439/108 |
| 5,710,393 | A * | 1/1998 | Smith et al. .................. | 174/74 R |
| 6,124,550 | A * | 9/2000 | Funken et al. .................. | 174/78 |
| 6,371,805 | B1 * | 4/2002 | Wang et al. .................... | 439/581 |
| 6,380,485 | B1 * | 4/2002 | Beaman et al. ............. | 174/88 R |
| 6,580,034 | B2 * | 6/2003 | Daane et al. ............... | 174/117 F |
| 7,510,425 | B2 * | 3/2009 | Kuo et al. ...................... | 439/493 |

FOREIGN PATENT DOCUMENTS

JP 2012-49035 A 3/2012

\* cited by examiner

*Primary Examiner* — William H Mayo, III
*Assistant Examiner* — Krystal Robinson
(74) *Attorney, Agent, or Firm* — Drinker Biddle & Reath LLP

(57) ABSTRACT

A multi-core cable assembly is formed by arranging a plurality of cables side by side and connecting the cables to a substrate 30 which is a connection member. The plurality of cables configure flat cable units 10, 20 for each diameter of cables, and ground bars 16, 27 are fixed thereto so as to be electrically connected with a shield member included in the cable. Each of ground bars 16, 27 are electrically connected to a ground pad 31 of the substrate 30. The ground bars 16, 27 adjacent to each other are disposed to be shifted in a longitudinal direction of the cable. In addition, two ground bars 16, 27 interposing the other one ground bar and positioned at both sides thereof are disposed in a position overlapped in the longitudinal direction of the cables.

5 Claims, 7 Drawing Sheets

MULTI-CORE CABLE ASSEMBLY

CROSS-REFERENCE TO RELATED APPLICATIONS

This application claims priority from Japanese Patent Application No. 2012-154180, filed on Jul. 10, 2012, the entire contents of which are hereby incorporated by reference.

FIELD OF INVENTION

The present invention relates to a multi-core cable assembly in which a plurality of cables having different diameters are connected to a connection member such as a substrate.

DESCRIPTION OF RELATED ART

For example, a flat cable unit obtained by assembling and integrating a plurality of thin coaxial cables has been used as a cable harness which is connected to a probe of medical equipment such as an ultrasound diagnostic device.

In an example of the flat cable unit, a plurality of coaxial cables are disposed in parallel, the sheath of the coaxial cables are removed, and a shield member, an insulator, and a center conductor are exposed in order, in a stepped manner. Ground bars which separately lock the coaxial cables are fixed to each shield member and a pitch of coaxial cables is determined.

In a case of manufacturing a multi-core cable assembly by connecting the flat cable unit to a connection member such as a substrate or a connector, a center conductor of each coaxial cable is connected to a signal terminal unit of the connection member, and the ground bars fixed to the shield member of each coaxial cable are connected to a ground pad of the connection member. This connection is performed by soldering or the like. Accordingly, the ground bars fixed to the shield member of each coaxial cable, and the ground pad of the connection member such as a substrate, are connected to each other.

In such a configuration of connecting the cables to a substrate or a connector such as a probe of medical equipment, depending on specifications of the product thereof, there is a product using a composite cable formed of a plurality of cables having different diameters, or a composite cable formed of both coaxial cables having different structures and twinaxial (twinax) cables. The twinax cable has a structure that signal lines become a twisted pair cable for balanced transmission and the pair cable is covered by a shield member which is a metal material.

Regarding such a configuration of the composite cable formed of a plurality of cables having different diameters described above, for example, a configuration of collectively connecting the plurality of cables having different diameters to a ground bar is disclosed in JP-A-2012-49035. Herein, to realize both high speed transmission and low speed transmission, a shield member of a coaxial cable or a drain wire of a twinax cable for high speed transmission having different line diameters, and an insulated electric wire for low speed transmission is connected to the same ground bar.

In a case of connecting a plurality of cables having different diameters to a connection member such as a substrate or a connector, a configuration in that the plurality of cables are interposed between a ground pad and a ground bar and are fixed therebetween by filling the inside thereof with soldering, is considered. However, in this case, since a space between the ground pad and the ground bar is regulated according to a diameter of a thick cable, a thin cable may become unstable, and connection workability or connection precision may be degraded.

For example, as disclosed in JP-A-2012-49035, in a case of a composite cable including a plurality of cables having different diameters, if all cables are collectively fixed to the ground bar, connection with respect to a substrate is difficult to be properly performed due to different connection conditions of each cable.

Herein, it is considered that, among the cables having different diameters, cables having the same diameter are collectively fixed to the ground bar to create flat cable units for the cables having the same diameter, and the flat cable units are arranged to be collectively connected to the connection member.

However, the ground bar having each flat cable unit includes edge portions at both ends thereof. The edge portions are protruded outside in an arrangement direction with respect to the arranged cables. This is because it is necessary to provide soldering space so as not to damage cables by heat of soldering, at the time of connecting the ground bar of the flat cable unit to the ground pad of the substrate.

In a case of arranging such a plurality of flat cable units to connect to the connection member such as a substrate, the connection is disturbed by interference of the edge portions of the ground bar, and the connection with respect to the connection member of a predetermined space becomes difficult to perform. Also, in a case of cutting the ground bar, since there is a risk of external damage on cables, it is difficult to cut the ground bar in the vicinity of the cables.

In addition, it is possible to deal with the configuration by expanding the size of the connection member such as a substrate itself, according to the width of all arranged flat cable units, however, in this case, the size of the connection member tends to be large. Although the size thereof approximately has a length of the edge portions of the ground bar, the large size of the connection member is not acceptable due to demands of the market.

Alternatively, there is consideration of connecting each cable to the ground pad on the connection member side, without using the ground bar. In this case, it is necessary to manually connect the cables to the ground pad one by one, and the process becomes complicated. In addition, if soldering connection is manually performed, the amount of solder to be used becomes large, and a height (or thickness) of the soldered portion becomes large. Further, insulating failure may occur due to external damage on the sheath of the cables due to heat of soldering.

SUMMARY OF INVENTION

An object of the present invention is to provide a multi-core cable assembly in which it is unnecessary to expand a connection member, and connection can be performed by securing excellent workability and reliability of cables, at the time of connecting a plurality of cables having different diameters to a connection member such as a substrate or a connector.

DETAILED DESCRIPTION OF EXEMPLARY EMBODIMENT

A multi-core cable assembly according to the present invention has a configuration that a plurality of cables having different diameters are arranged in parallel and are connected to a connection member such as a substrate or a connector, and have a configuration that a width of the connection member in the arrangement direction of the cables is not necessary to be expanded, and connection workability and reliability of cables can be secured. As the cables used for the multi-core cables, coaxial cables having different diameters or two-core cables (twinax cables) are used.

The multi-core cable assembly is formed by arranging a plurality of cables in a line and connecting the cables to a connection member, the plurality of cables includes cables having different diameters, and are divided into a plurality of groups for each diameter of the cables. Ground bars are fixed to each of the plurality of groups so as to be electrically connected to a shield member included in the cables, the plurality of cables are disposed between the ground bars and a ground pad included in the connection member, and the ground bar of each group is electrically connected to the ground pad. The ground bars adjacent to each other in an arranged direction of the cables are disposed to be deviated in a longitudinal direction of each cable.

In addition, the two ground bars interposing the other ground bar and positioned at both sides thereof, in the arranged direction of the cables, are disposed on a position overlapped in the longitudinal direction of each cable.

In addition, a center conductor of cable of each group is connected to the connection member, at the same position in a length direction of the cable.

In addition, the plurality of cables include coaxial cables and two-core cables, and the same category of cables and cables having the same diameter are set to be one group.

In addition, the two-core cable includes two insulated cores obtained by insulated coating of a center conductor, and includes a shield member which covers the two insulated cores, and the shield member of each two-core cable is fixed to a ground bar by soldering.

In addition, the two-core cable includes a drain wire, the drain wire is folded in a length direction of the two-core cable, and a distal end thereof is fixed to a ground bar.

In addition, coaxial cables having different diameters are included, and the coaxial cables having the same diameter are set to be one group.

According to a multi-core coaxial cable harness of the present invention, it is unnecessary to expand the connection member, and connection can be performed by securing excellent workability and reliability of cables, at the time of connecting a plurality of cables having different diameters to the connection member such as a substrate or a connector.

Figure 1:
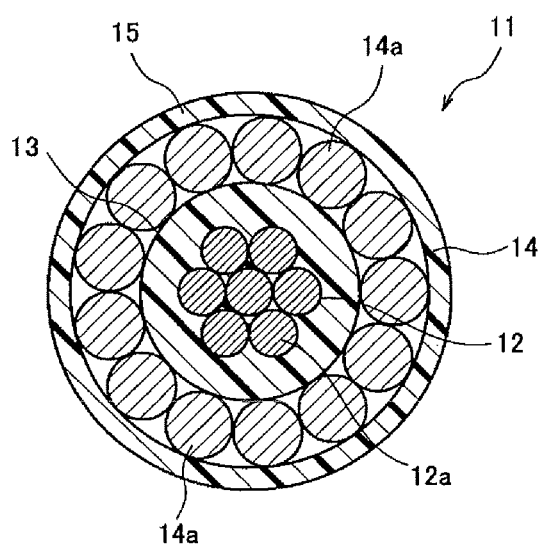
FIG. 1 is a cross-sectional view showing a configuration example of a coaxial cable applied to a multi-core cable assembly according to the present invention.

FIG. 1 is a cross-sectional view showing a configuration example of a coaxial cable applied to a multi-core cable assembly according to the present invention. A coaxial cable 11 includes a center conductor 12 at the center thereof, and an insulator 13, a shield member 14, and sheath 15 are provided in order to make a coaxial shape, in vicinity of the center conductor 12.

The center conductor 12 is formed by twisting a plurality of tinned copper alloy lines 12a, for example, and the insulator 13 is formed by covering the outer periphery thereof with insulated materials formed of polyolefin (such as polyethylene, or foamed polyethylene), ethylene-vinyl acetate copolymer resins (EVA), ethylene-ethyl acrylate copolymer resins (EEA), vinyl chloride resins (PVC), fluorine resins, and the like.

The shield member 14 is an external conductor obtained by winding a plurality of conductors 14a which are copper alloy lines, by spiral covering or by making them in a braid structure. The sheath 15 formed of resins such as polyester or the like is covered on the outer periphery side of the shield member 14.

Figure 2:
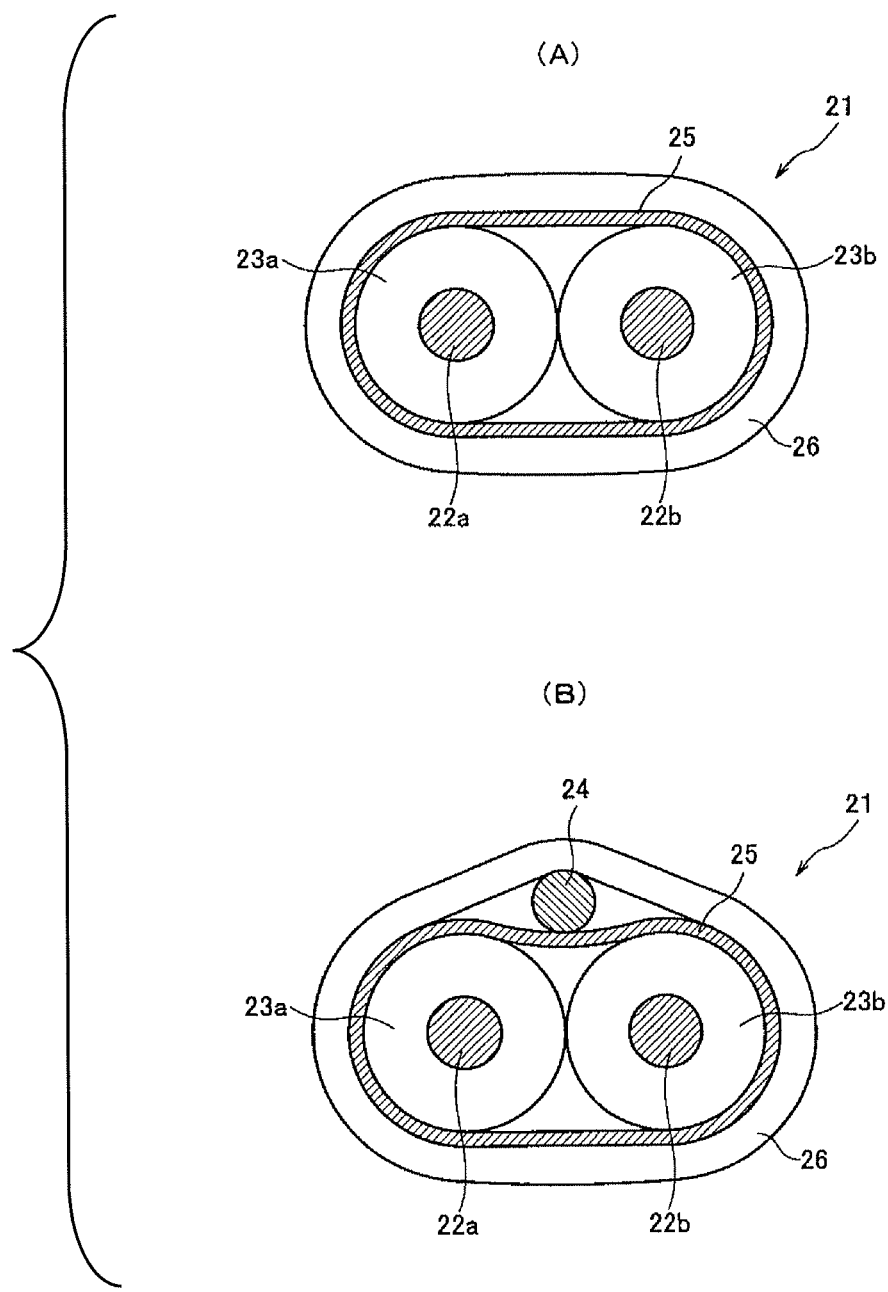
FIG. 2 is a cross-sectional view showing a configuration example of a twinax cable applied to a multi-core cable assembly according to the present invention.

FIG. 2 is a cross-sectional view showing a configuration example of a twinax cable applied to a multi-core cable assembly according to the present invention, wherein FIG. 2(A) and FIG. 2(B) show different configuration example of the twinax cable.

A twinax cable 21 of FIG. 2(A) includes insulated cores 23a, 23b which are covered for insulation of center conductors 22a and 22b, a shield member 25, and sheath 26.

As the center conductor 22a and 22b, a conductor such as copper or aluminum, or a single wire or a twisted wire obtained by performing plating of silver or tin to the conductor can be used. In addition, a conductor having two-layered structure in that a surface side is set to have low resistance and a center side is set to have high resistance, may be used.

For a portion of a covering layer of the insulated cores 23a, 23b, fluorine resins, polyethylene, polypropylene, and the like are used. The two insulated cores 23a, 23b may be twisted with respect to each other, or may be arranged in parallel without being twisted. The shield member 25 is a member which is applied so as to include the two insulated cores 23a, 23b, and is provided by helically winding shield tape such as Al-PET, for example.

The twinax cable 21 of FIG. 2(B) includes a drain wire 24, in addition to the configuration of FIG. 2(A). The drain wire 24 is provided so as to come in contact with the shield member 25, and is a conductive wire such as annealed copper, tinned annealed copper, copper alloy, aluminum, aluminum alloy, or the like. The drain wire 24 is provided in a state of being attached parallel to the insulated cores 23a, 23b.

The shield member 25 is provided so as to cover the insulated cores 23a, 23b as shown in FIG. 2(B), and the drain wire 24 is fit to the outside thereof. At that time, in a case where the shield member 25 uses the shield tape having two-layered structure such as Al-PET, a metal layer of Al is set to be outside and the metal layer thereof and the drain wire 24 are electrically connected to each other. The sheath 26 collectively covers the two insulated cores 23a, 23b, the shield member 25, and the drain wire 24.

On the twinax cable, by putting the metal foil of the shield member 25 inside, the insulated cores 23a, 23b, and the drain wire 24 are covered together by the shield member 25. In this case, the shield member 25 is provided so as to cover the insulated cores 23a, 23b, and the drain wire 24 arranged parallel to a recessed portion where the insulated cores 23a, 23b are arranged. Alternatively, the insulated cores may be twisted each other.

Next, a configuration of a flat cable unit applying such coaxial cables or twinax cables will be described.

The multi-core cable assembly of the present invention includes a plurality of cables having different diameters. The plurality of cables are collected by cables having the same diameter, and configure a plurality of flat cable units for each cable diameter. the multi-core cable assembly has a configuration that the plurality of flat cable units are arranged to be connected to the connection member such as a substrate or a connector.

Figure 3:
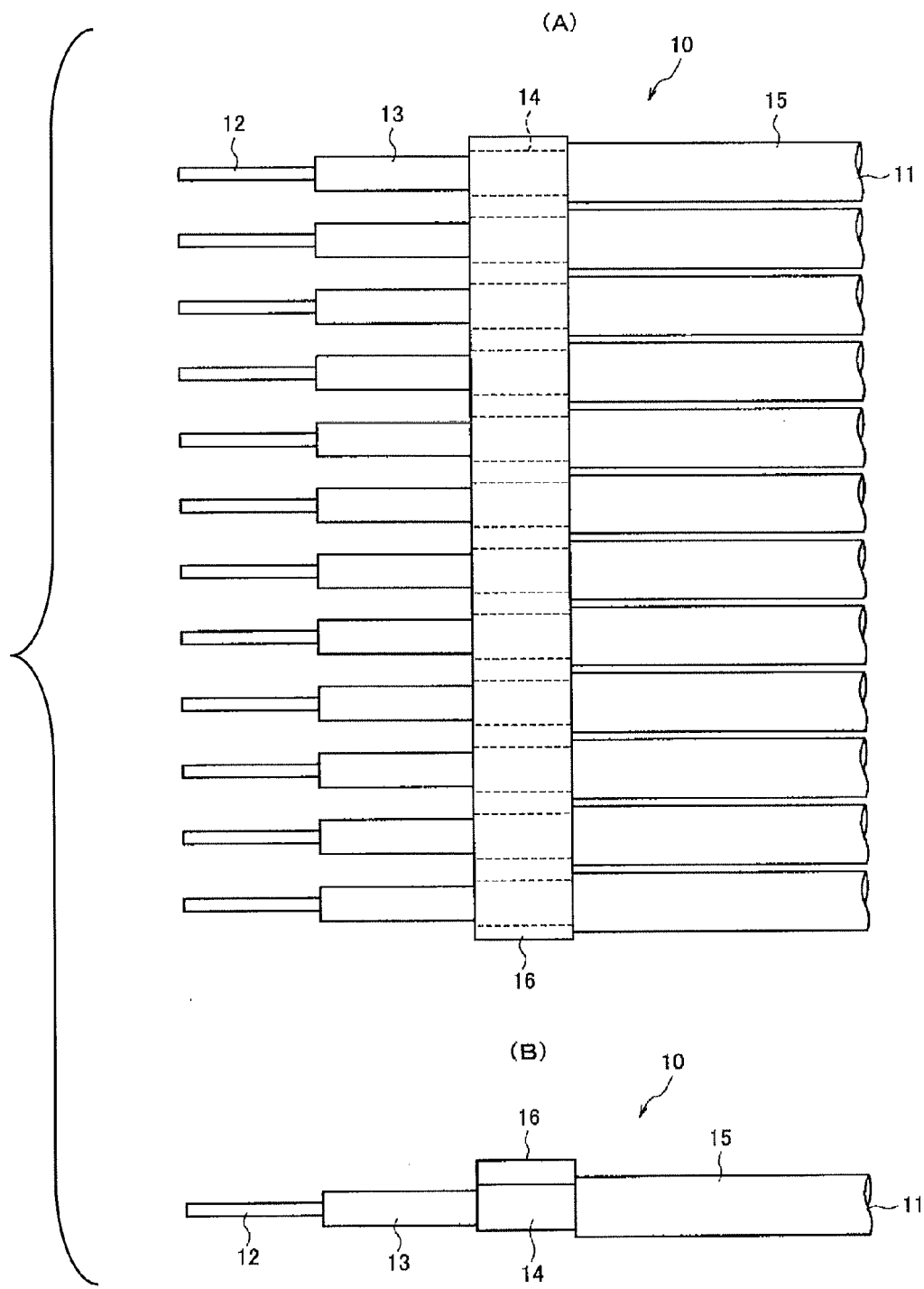
FIG. 3 is a view showing a configuration of a flat cable unit applying coaxial cables.

FIG. 3 is a view showing a configuration of the flat cable unit applying coaxial cables, wherein FIG. 3(A) is a plan view of a front end portion of the flat cable unit, and FIG. 3(B) is a side view showing the flat cable unit. In a flat cable unit 10, the plurality of coaxial cables 11 having the same diameter are arranged, and the ground bar 16 is fixed thereto to be integrated.

In the flat cable unit 10, from each coaxial cable 11 before the ground bar 16 is fixed, the center conductor 12, the insulator 13, and the shield member 14 are exposed in a stepped shape. Herein, with respect to each of the plurality of coaxial cables 11 having the same diameter arranged in a plan surface, for example, a predetermined length of the sheath 15 is removed to expose the shield member 14. Then, the shield member 14 is cut at a predetermined position, the shield member 14 on a front end side with respect to the cut position is removed to expose the insulator 13. At that time, a given length of the shield member 14 is exposed.

Then, the ground bars 16 are fixed to the shield members 14 exposed from the plurality of coaxial cables 11. Herein, for example, thread soldering is interposed between the ground bars 16 and the shield members 14, or paste soldering is applied to the ground bars 16, and heating with a pulse heater is performed for fixing. Accordingly, the ground bar 16 is electrically connected to the shield member 14 of each coaxial cable 11.

Next, in the front end portion of the coaxial cable 11 to which the ground bar 16 is fixed, the insulator 13 is removed from the ground bar 16 in a predetermined position, and the center conductor 12 is exposed, and accordingly, a flat cable unit 10 as shown in FIG. 3 can be manufactured.

The steps described above are steps showing an example of a process at the time of manufacturing the flat cable unit 10, and other configurations or steps in which the shield member 14 and the ground bar 16 are electrically connected to each other can be suitably employed. This is applied to the following FIGS. 4 and 5, in the same manner.

Figure 4:
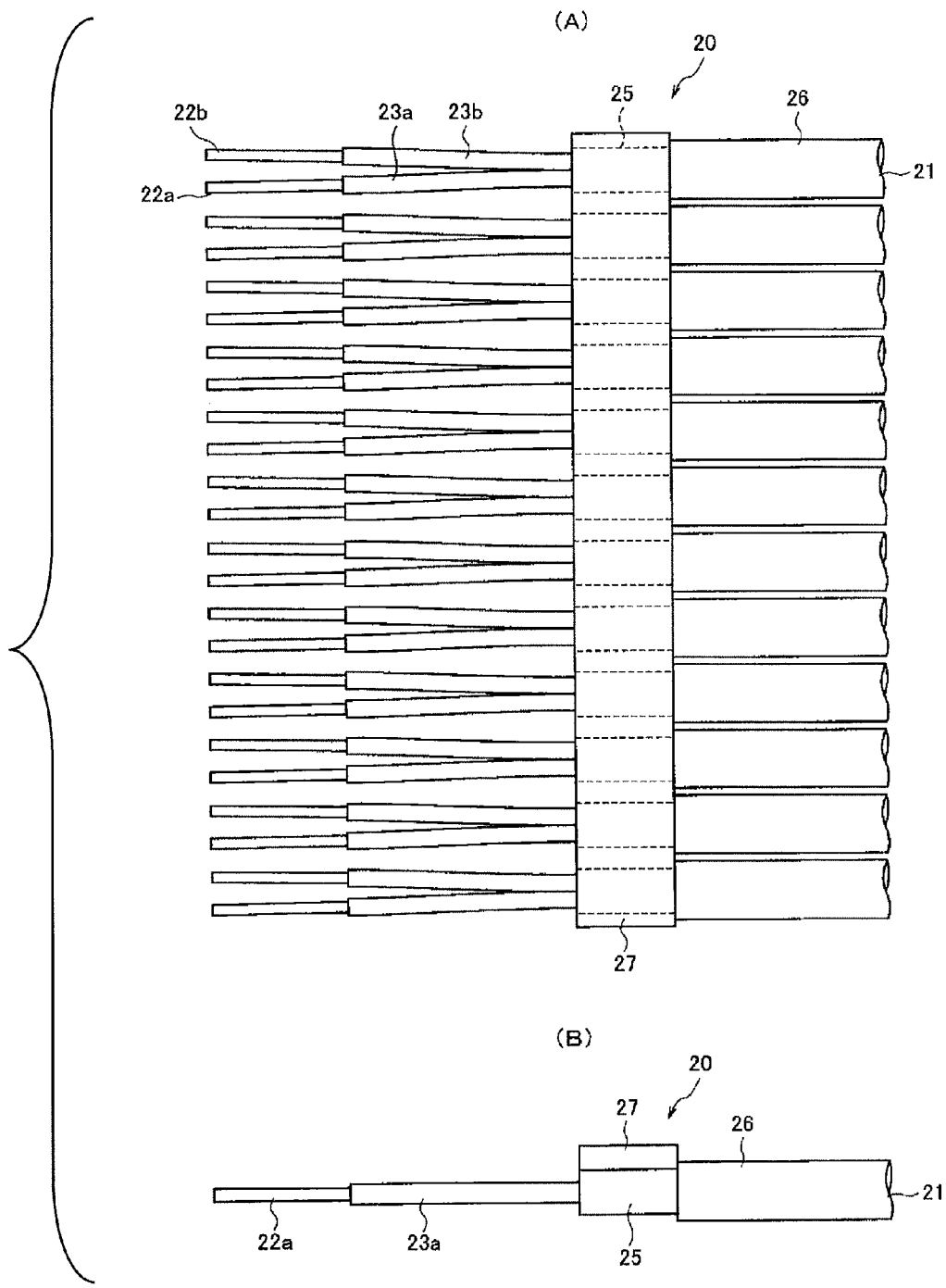
FIG. 4 is a view showing a configuration example of a flat cable unit applying twinax cables.

FIG. 4 is a view showing a configuration example of a flat cable unit applying twinax cables, wherein FIG. 4(A) is a plan view of a front end portion of the flat cable unit, and FIG. 4(B) is a side view of the flat cable unit.

In a flat cable unit 20, the plurality of twinax cables 21 having the same outer diameter are arranged, and ground bars 27 are fixed thereto to be integrated.

In this case, from each twinax cable 21 before the ground bar 27 is fixed, the insulated cores 23a, 23b, and the shield member 25 are exposed in a stepped shape. The ground bar 27 is fixed to the exposed shield member 25 using thread soldering or paste soldering. Accordingly, the ground bar 27 is electrically connected with the shield member 25 of each twinax cable 21. Then, the coating layer of the insulated cores 23a, 23b on a predetermined position from the ground bar 27 on a front end side is removed to expose each of center conductors 22a and 22b. Accordingly, the flat cable unit 20 can be manufactured. This configuration can be applied to the twinax cable 21 shown in FIG. 2(A).

Figure 5:
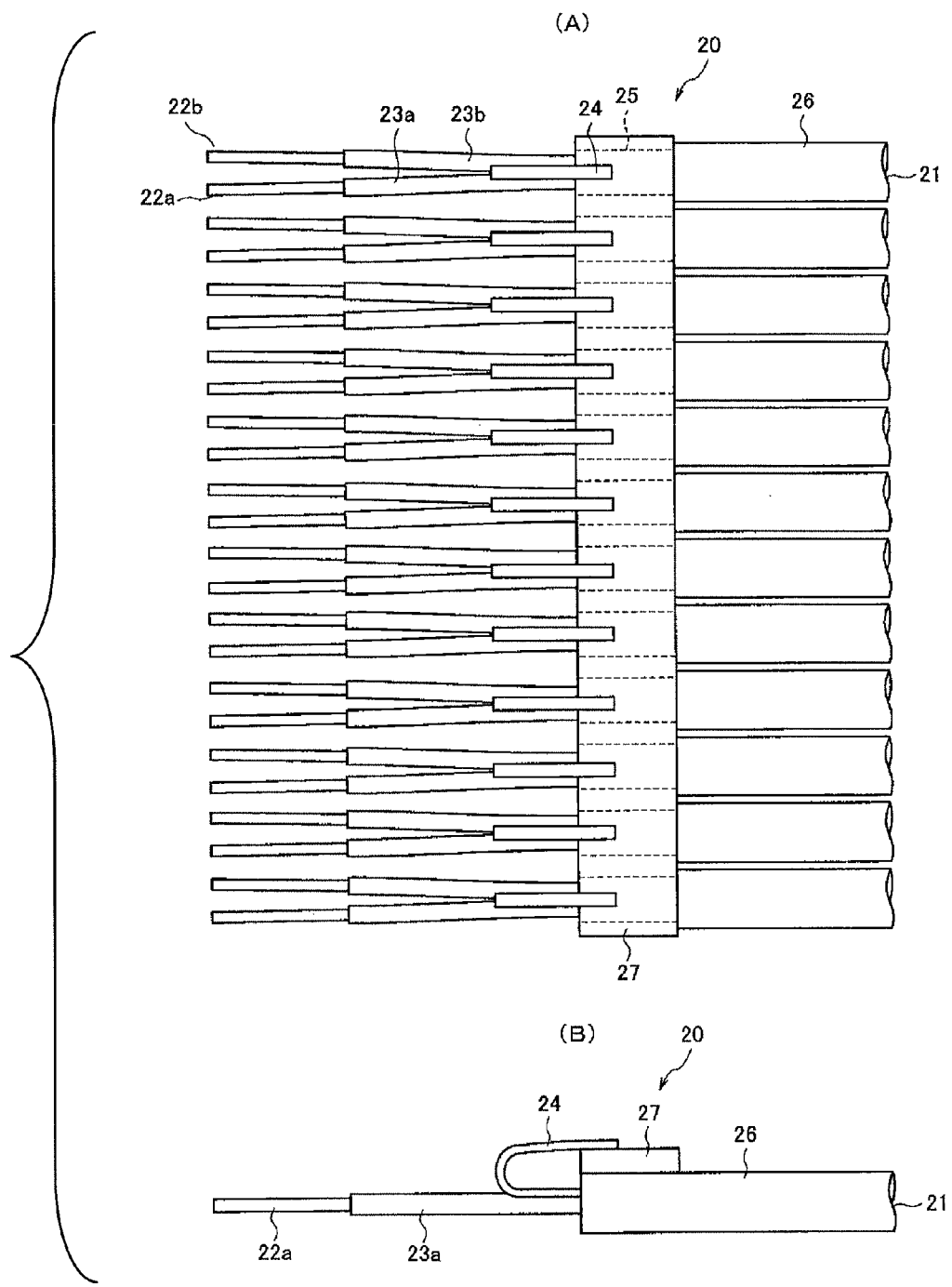
FIG. 5 is a view showing the other configuration example of a flat cable unit applying twinax cables.

FIG. 5 is a view showing the other configuration example of the flat cable unit applying twinax cables, wherein, the FIG. 5(A) is a plan view of a front end portion of the flat cable unit, and FIG. 5(B) is a side view of the flat cable unit.

In this example, the drain wire 24 of the twinax cable 21 is connected to the ground bar 27. In this case, from each cable 21 before the ground bar 27 is connected, a predetermined length of the sheath 26 is peeled off, the insulated cores 23a, 23b are exposed, and the drain wire 24 is also derived therefrom.

The drain wire 24 is folded back in a longitudinal direction of the twinax cable 21 to fix the front end portion thereof to the ground bar 27. For the fixing of the ground bar 27, a conductive adhesive or low-temperature soldering for preventing damage on the sheath 26 is used, for example. Accordingly, the shield member and the ground bar 27 are electrically connected to each other through the drain wire 24. Then, the coating layer of the insulated cores 23a, 23b is removed in a predetermined position from the ground bar 27 on the front end side, and each of the center conductors 22a and 22b is exposed. Accordingly, the flat cable unit 20 can be manufactured. This configuration can be applied to the twinax cable 21 of the configuration shown in FIG. 2(B).

Figure 6:
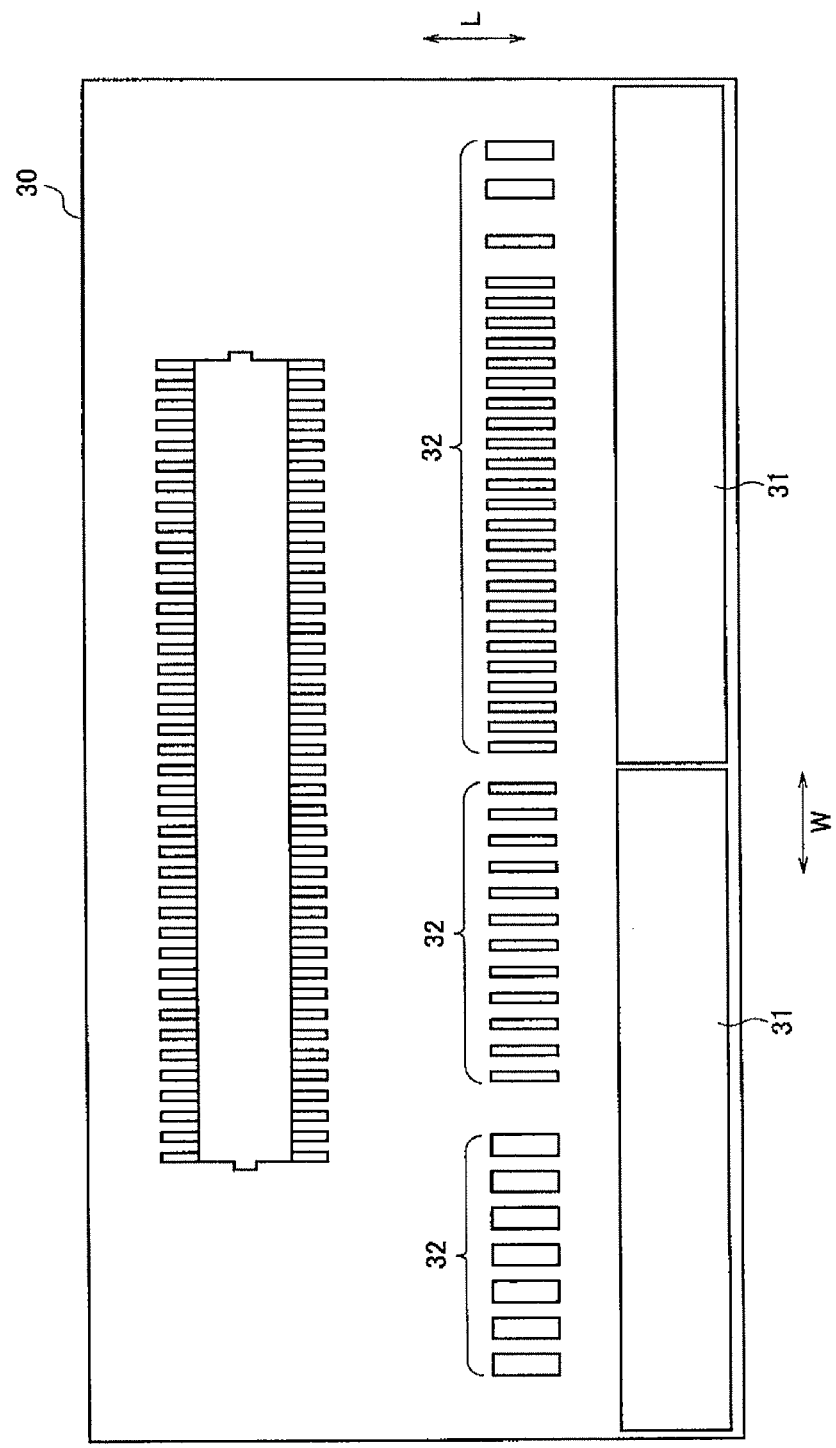
FIG. 6 is a view showing a configuration of a substrate connecting flat cable units.

FIG. 6 is a view showing a configuration of a substrate connecting flat cable units. A substrate 30 is an example of a connection member connecting the plurality of cables by arranging in a line, and is provided on a probe of medical equipment, for example. The substrate 30 includes a plurality of signal terminal portions 32 for connecting the center conductor which is a signal transmission path of the cables and ground pads 31 for connecting the ground bars of the flat cable unit.

When the arrangement direction of the plurality of cables included in the flat cable units is set as a width direction W of the substrate 30, the ground pads 31 are provided in the approximately all areas of the substrate 30 in the width direction W. In addition, the length of the ground pad 31 in a direction (which is set as a longitudinal direction L of the cables) perpendicular to the width direction (W) is set to be longer compared to that in configuration of manually soldering the plurality of cables on the ground pad, for example. As will be described later, since the ground bars of the flat cable units are disposed so as to be shifted in the longitudinal direction L of the cables, the length of the ground pad 31 in the longitudinal direction L is expanded. In this case, without expanding the width of the substrate 30, the ground pad 31 expanded in the longitudinal direction L can be formed using the space of the substrate 30.

Figure 7:
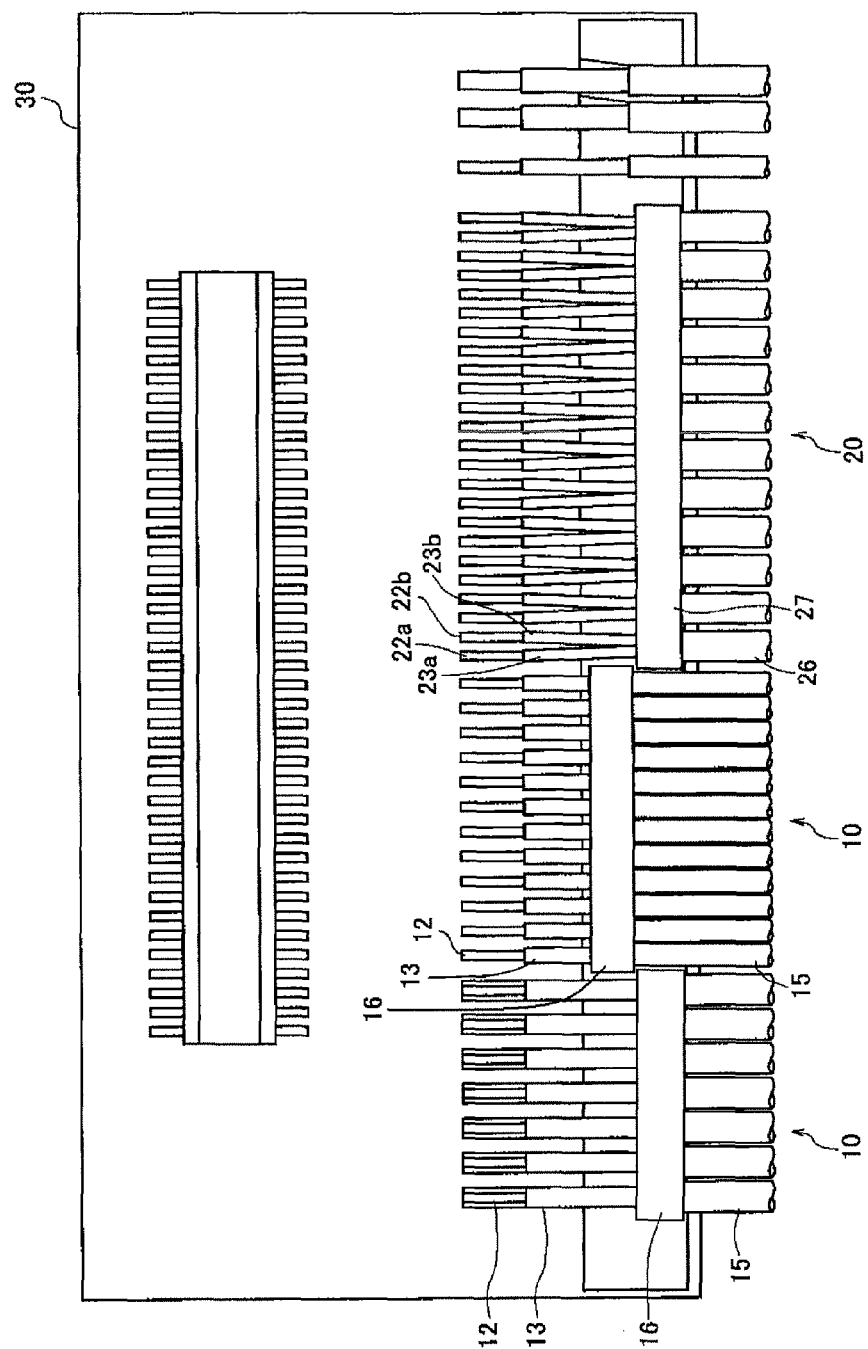
FIG. 7 is a view showing a configuration example of a multi-core cable assembly according to the present invention.

FIG. 7 is a view showing a configuration example of the multi-core cable assembly according to the present invention, and shows a configuration that the plurality of flat cable units 10, 20 having different cable diameters are connected with respect to the substrate 30 of FIG. 6.

In this example, the cables having three types of diameters are connected with respect to the plurality of signal terminal portions 32 provided on one substrate 30. Among the three types of cables, two types thereof are coaxial cables and configure two flat cable units 10 collected for each diameter. In addition, the other one cable is the twinax cable, and configures the flat cable unit 20. The flat cable unit 10 includes the configuration same as FIG. 3, and the ground bar 16 is fixed to the shield member 14 of the plurality of coaxial cables 11 having the same diameter. In addition, the flat cable unit 20 includes the configuration same as FIG. 4, and the ground bar 27 is electrically connected to the shield member 25 of the plurality of twinax cables 21 having the same diameter.

In the multi-core cable assembly, in the two flat cable units 10 using the coaxial cables, each ground bar 16 is connected to the ground pad 31 of the substrate 30 by soldering. The center conductor 12 of each coaxial cable 11 is connected to the signal terminal portion 32 by soldering.

In addition, in the flat cable unit 20 using the twinax cables, the ground bar 27 is connected to the ground pad 31 by soldering, and each of the center conductors 22a and 22b of the twinax cable 21 is subsequently connected to the signal terminal portion 32 in order, by soldering.

The connection of the ground bars 16, 27 with respect to the ground pad 31 can be performed by filling the portion between the ground pad 31 and the ground bars 16, 27 by soldering, or can be performed by giving a conductive vertical bridge portion substantially corresponding to the diameter of the cables to the end portions of the ground bars 16, 27 to electrically connect the ground bars 16, 27 to the ground pad 31 through the vertical bridge portion.

In the multi-core cable assembly of the example as described above, the cables having different diameters are included in the plurality of cables connected to the substrate 30 which is a connection member. The plurality of cables are divided into groups of the cables having the same diameter and the category of the cables, and thereby the flat cable units 10, 20 are formed. In each of the flat cable units 10, 20, the ground bars 16, 27 are electrically connected to the shield members 17 and 25 of each cable, and the ground bars 16, 27 are connected to the ground pad 31 of the substrate 30. Accordingly, the cables (the coaxial cable 11 and the twinax cable 21) are collected for each cable having the same diameter, and are fixed in a state of being interposed by the ground bars 16, 27 and the ground pad 31.

Among the plurality of flat cable units 10, 20, the ground bars 16, 27 of the flat cable units 10, 20 adjacent to each other, are connected to the ground pads 31 in a position switched to each other in the longitudinal direction of each cable (the coaxial cable 11 and the twinax cable 21). Accordingly, without interference of the edge portions of the end portions of the ground bars 16, 27 of the flat cable units 10, 20 to each other, and without expanding the space of the substrate 30 in the width direction W, the plurality of cables having different diameters can be connected to the substrate 30.

In addition, among the ground bars 16, 27, the two ground bars interposing the other ground bar are disposed on a position overlapped in the longitudinal direction of each cable. Accordingly, it is possible to suppress a length of the ground pad 31 of the substrate 30 in the longitudinal direction L of the cable to its minimum, and it is possible to form the ground pad 31 using the space of the substrate 30 without expanding the area of the substrate 30.

In the configuration described above, the plurality of cables (coaxial cables 11 and twinax cables 21) having different diameters are connected to the substrate 30, and the same configuration can also be employed for other connection members such as a connector. By the configuration, when connecting the plurality of cables having different diameters to the connection member such as a substrate or a connector, it is possible to secure excellent workability and reliability of cables and to perform the connection, without expanding the connection member.

What is claimed is:

1. A multi-core cable assembly which is formed by arranging a plurality of cables side by side and connecting the cables to a connection member,
    wherein the plurality of cables include cables having different diameters, and are divided into a plurality of groups for each diameter of the cables,
    ground bars are fixed to each of the plurality of groups so as to be electrically connected to a shield member included in the cables,
    the plurality of cables are disposed between the ground bars and a ground pad included in the connection member,
    the ground bar of each group is electrically connected to the ground pad, and
    the ground bars adjacent to each other in an arranged direction of the cables are disposed to be deviated in a longitudinal direction of each cable,
    wherein of the plurality of ground bars there are two ground bars interposing another ground bar and positioned at both sides thereof, in the arranged direction of the cables, are disposed on a position overlapped in the longitudinal direction of each cable, and
    wherein a center conductor of cable of each group is connected to the connection member, at the same position in a length direction of the cable.

2. The multi-core cable assembly according to claim 1, wherein the plurality of cables include coaxial cables and two-core cables, and the same category of cables and cables having the same diameter are set to be one group.

3. The multi-core cable assembly according to claim 2, wherein the two-core cable includes two insulated cores obtained by insulated coating of a center conductor, and includes a shield member which covers the two insulated cores, and the shield member of each two-core cable is fixed to a ground bar by soldering.

4. The multi-core cable assembly according to claim 3, wherein the two-core cable includes a drain wire, the drain wire is folded back in a length direction of the two-core cable, and a distal end thereof is fixed to a ground bar.

5. The multi-core cable assembly according to claim 2, wherein coaxial cables having different diameters are included, and the coaxial cables having the same diameter are set to be one group.

* * * * *